US010978610B2

(12) United States Patent
Okada (10) Patent No.: US 10,978,610 B2
(45) Date of Patent: Apr. 13, 2021

(54) NITRIDE SEMICONDUCTOR LIGHT-EMITTING ELEMENT AND METHOD OF MANUFACTURING THE SAME

(71) Applicant: NICHIA CORPORATION, Anan (JP)

(72) Inventor: Takuya Okada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/556,162

(22) Filed: Aug. 29, 2019

(65) Prior Publication Data

US 2020/0075795 A1   Mar. 5, 2020

(30) Foreign Application Priority Data

Aug. 31, 2018 (JP) .............................. JP2018-162959

(51) Int. Cl.
*H01L 33/00* (2010.01)
*H01L 33/32* (2010.01)
(Continued)

(52) U.S. Cl.
CPC ........ *H01L 33/0075* (2013.01); *H01L 29/155* (2013.01); *H01L 33/007* (2013.01); *H01L 33/06* (2013.01); *H01L 33/325* (2013.01)

(58) Field of Classification Search
CPC ... H01L 33/0062–0075; H01L 33/0025; H01L 33/002; H01L 33/30–325; H01L 33/0033–0037; H01L 33/04–06
See application file for complete search history.

(56) References Cited

U.S. PATENT DOCUMENTS 6,979,835 B1 * 12/2005 Yu ........................ B82Y 20/00
                                                        257/103
7,547,909 B2 *  6/2009 Park ....................... H01L 33/32
                                                         257/14
(Continued)

FOREIGN PATENT DOCUMENTS

JP        2005-109425 A      4/2005
JP        2010-067927 A      3/2010
(Continued)

OTHER PUBLICATIONS

Machine translation of JP-2012069982-A (Year: 2012).*

*Primary Examiner* — Erik T. K. Peterson
*Assistant Examiner* — Mesfin T Alo
(74) *Attorney, Agent, or Firm* — Foley & Lardner LLP (57) ABSTRACT

A method of manufacturing a nitride semiconductor light-emitting element includes growing an n-side semiconductor layer, an active layer, and a p-side semiconductor layer. The step of growing the active layer includes growing a first barrier layer before growing a well layer. The step of growing the first barrier layer includes a first stage where a first nitride semiconductor layer containing In is grown with a first concentration of n-type impurity, a second stage where a second nitride semiconductor layer containing In is grown with a second concentration of n-type impurity higher than the first concentration, a third stage where a third nitride semiconductor layer containing In is grown with a third concentration of n-type impurity lower than the second concentration, and a fourth stage where a fourth nitride semiconductor layer is grown under a growth condition in which an amount of an impurity source gas is decreased or stopped.

15 Claims, 2 Drawing Sheets

(51) Int. Cl.
*H01L 29/15* (2006.01)
*H01L 33/06* (2010.01)

(56) References Cited

U.S. PATENT DOCUMENTS

| | | | |
|---|---|---|---|
| 7,649,195 B2* | 1/2010 | Lee | H01L 33/06 257/13 |
| 8,399,896 B2* | 3/2013 | Hikosaka | H01L 33/06 257/94 |
| 8,680,508 B2* | 3/2014 | Hikosaka | H01L 33/06 257/14 |
| 9,466,761 B2* | 10/2016 | Choi | H01L 33/06 |
| 2005/0067613 A1 | 3/2005 | Kim | |
| 2007/0063207 A1* | 3/2007 | Tanizawa | B82Y 20/00 257/94 |
| 2014/0048771 A1 | 2/2014 | Takahashi et al. | |

FOREIGN PATENT DOCUMENTS

| | | | | |
|---|---|---|---|---|
| JP | 2012069982 A * | 4/2012 | | H01L 33/32 |
| JP | 2016-149399 A | 8/2016 | | |
| WO | WO-2013/132812 A1 | 9/2013 | | |

\* cited by examiner

NITRIDE SEMICONDUCTOR LIGHT-EMITTING ELEMENT AND METHOD OF MANUFACTURING THE SAME

CROSS-REFERENCE TO RELATED APPLICATION

This application claims priority to Japanese Patent Application No. 2018-162959, filed on Aug. 31, 2018, the contents of which are hereby incorporated by reference in their entirety.

BACKGROUND

The present disclosure relates to a nitride semiconductor light-emitting element and a method of manufacturing the same.

It is known that, in a nitride semiconductor light-emitting element including a quantum well active layer, doping an n-type impurity into a barrier layer of an active layer, especially into a barrier layer of an n-type layer side, allows for reducing a forward voltage Vf (for example, see in paragraphs 0009 to 0012 of Japanese Patent Publication No. 2005-109425). On the other hand, Japanese Patent Publication No. 2005-109425 also describes that doping of n-type impurity into the barrier layer may cause reduction in light-emission efficiency.

SUMMARY

As described in Japanese Patent Publication No. 2005-109425, doping of n-type impurity into the barrier layer allows for reducing the forward voltage Vf but may cause reduction in the light-emission efficiency.

Accordingly, one object of certain embodiments of the present invention is to provide a nitride semiconductor light-emitting element with a low forward voltage Vf and high light-emission efficiency, and a method of manufacturing the nitride semiconductor light-emitting element.

According to one embodiment, a method of manufacturing a nitride semiconductor light-emitting element includes growing an n-side nitride semiconductor layer on a substrate; growing an active layer on the n-side nitride semiconductor layer; and growing a p-side nitride semiconductor layer on the active layer. The step of growing the active layer includes, before growing a well layer that is nearest to the n-side nitride semiconductor layer, growing a first barrier layer such that first barrier layer is located between the well layer and the n-side nitride semiconductor layer. The step of growing the first barrier layer includes a first stage in which a first nitride semiconductor layer that contains In is grown to have a first thickness under a growth condition in which a concentration of n-type impurity is set to be a first concentration, a second stage in which a second nitride semiconductor layer that contains In is grown to have a second thickness greater than the first thickness under a growth condition in which the concentration of n-type impurity is set to be a second concentration higher than the first concentration, a third stage in which a third nitride semiconductor layer that contains In is grown to have a third thickness smaller than the second thickness under a growth condition in which the concentration of n-type impurity is set to be a third concentration lower than the second concentration, and a fourth stage in which a fourth nitride semiconductor layer is grown to have a fourth thickness under a growth condition, in which an amount of an impurity source gas is less than the impurity source gas supplied during the first stage and the third stage or supply of the impurity source gas is stopped. The first stage, the second stage, the third stage, and the fourth stage are performed in this order.

According to another embodiment, a nitride semiconductor light-emitting element includes an n-side nitride semiconductor layer a p-side nitride semiconductor layer, and an active layer between the n-side nitride semiconductor layer and the p-side nitride semiconductor layer. The active layer includes a well layer disposed that is nearest to the n-side nitride semiconductor layer, and a first barrier layer between the well layer and the n-side nitride semiconductor layer. The first barrier layer includes a Si-doped InGaN barrier layer and an undoped GaN barrier layer in this order from an n-side nitride semiconductor layer side. In the InGaN barrier layer, a doping amount of Si at a central portion of the InGaN barrier layer is greater than a doping amount of Si at the n-side nitride semiconductor layer side of the InGaN barrier layer and a doping amount of Si at a well layer side of the InGaN barrier layer.

The method of manufacturing the nitride semiconductor light-emitting element according to certain embodiments of the present invention allows for manufacturing a nitride semiconductor light-emitting element with a low forward voltage Vf and high light-emission efficiency.

Also, in the nitride semiconductor light-emitting element according to certain embodiments of the present invention, the forward voltage Vf can be reduced and the light-emission efficiency can be improved.

DETAILED DESCRIPTION

Hereinafter, details of a nitride semiconductor light-emitting element according to certain embodiments of the present invention will be provided below. The inventor of the present invention has studied a nitride semiconductor light-emitting element in which the forward voltage Vf can be reduced and the decrease in light-emission efficiency can be reduced. In the nitride semiconductor light-emitting element including an n-side nitride semiconductor layer, an active layer with a quantum well structure, and a p-side nitride semiconductor layer, doping an n-type impurity into a barrier layer, especially into a barrier layer that is nearest to the n-side nitride semiconductor layer, allows for reducing the forward voltage V; as described above. On the other hand, doping the n-type impurity into the barrier layer may cause reduction in the light-emission efficiency.

The inventor studied a configuration of the nitride semiconductor light-emitting element, in which the barrier layer that is nearest to the n-side nitride semiconductor layer includes a nitride semiconductor layer (i.e., a lower nitride semiconductor layer), such as an InGaN layer, containing In and an n-type impurity such as Si, and an undoped nitride semiconductor layers (i.e., an upper nitride semiconductor layer), such as a GaN layer, containing no In and no n-type impurity. The inventor has found that such configuration can reduce the forward voltage Vf and suppress decrease in the light-emission efficiency to a certain level.

As a result of further studies, it has been confirmed that the forward voltage Vf and the light-emission efficiency change according to a distribution of the n-type impurity in the lower nitride semiconductor layer.

More specifically, as will be described below with reference to examples, the forward voltage Vf and the emission intensity in each of a Comparative Example, Case 1, Case 2, and Case 3 were compared. In the Comparative Example, the light-emitting element included a lower nitride semiconductor layer that was grown, using n-type impurity source gas at a constant injection rate (i.e., a standard injection rate) from a start to an end of growth.

In Case 1, the light-emitting element included a lower nitride semiconductor layer that was grown via an initial stage, which is a predetermined period from the start of growth, an intermediate stage, and a final stage, which is a predetermined period until the end of growth. In the initial and final stages, the n-type impurity source gas was injected at a reduced rate. In the intermediate stage, the n-type impurity source gas was injected at the standard injection rate.

In Case 2, the light-emitting element included a lower nitride semiconductor layer that was grown such that the n-type impurity source gas was injected at a reduced rate in an initial stage, which is a predetermined period from the start of growth, and afterwards, the n-type impurity source gas was injected at a standard injection rate.

In Case 3, the light-emitting element included a lower nitride semiconductor layer that was grown such that the n-type impurity source gas was injected at a standard injection rate for a predetermined period from the start of growth, and afterwards, the n-type impurity source gas was injected at a reduced rate for a predetermined period until the end of growth.

As a result, it was confirmed that all the light-emitting elements in Cases 1 to 3 have emission intensities greater than that of the light-emitting element in the Comparative Example, allowing for more greatly preventing reduction in light-emission efficiency than that of the light-emitting element in the Comparative Example. On the other hand, the forward voltage Vf in each of Cases 1 to 3 tended to be greater than that of the light-emitting element in the Comparative Example.

However, it was confirmed that the forward voltage Vf of the light-emitting element in Case 1 was less increased than the forward voltages in Case 2 and Case 3. Also, the emission intensity in the Case 1 was higher and the decrease in light-emission efficiency was smaller than the light-emission efficiencies in Case 2 and Case 3.

A nitride semiconductor light-emitting element according to embodiments of the present invention is devised based on the findings of the inventor described above. In the nitride semiconductor light-emitting element according to embodiments of the present invention, a barrier layer that is located nearest to the n-side nitride semiconductor layer includes a nitride semiconductor layer (i.e., a lower nitride semiconductor layer) and an undoped nitride semiconductor layer (i.e., an upper nitride semiconductor layer). The lower nitride semiconductor layer, such as InGaN layer, contains In and n-type impurity such as Si. The upper nitride semiconductor layer, such as GaN layer, contains no In and no n-type impurity.

The barrier layer that is located nearest to the n-side nitride semiconductor layer includes a lower nitride semiconductor layer that was grown via an initial stage, which is a predetermined period from the start of growth, an intermediate stage, and a final stage, which is a predetermined period until the end of growth. In the initial and final stages, the n-type impurity source gas was injected at a reduced rate. In the intermediate stage, the n-type impurity source gas was injected at a standard injection rate.

This allows for providing the nitride semiconductor light-emitting element in which the forward voltage Vf is reduced and the light-emission efficiency is improved.

Nitride semiconductor light-emitting elements according to a first embodiment of the present invention will be described below with reference to the accompanying drawings.

Figure 1:
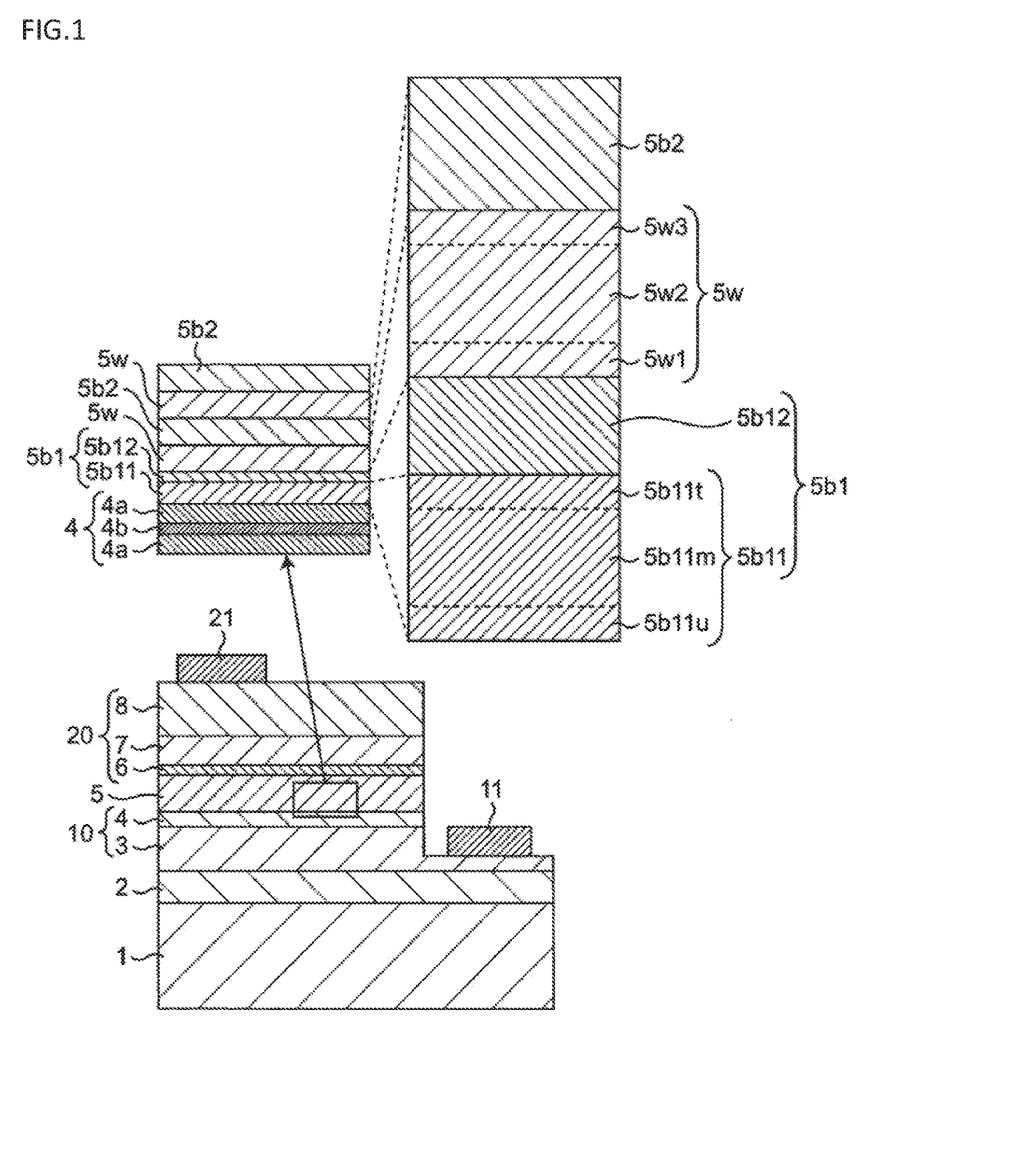
FIG. 1 is a schematic sectional view of a light-emitting element according to a first embodiment of the present invention.

The nitride semiconductor light-emitting element of the first embodiment includes a substrate 1, an underlayer 2, an n-side nitride semiconductor layer 10, an active layer 5, and a p-side nitride semiconductor layer 20, in this order.

The n-side nitride semiconductor layer 10 is formed above the substrate 1 such that the underlayer 2 is disposed between the n-side nitride semiconductor layer 10 and the substrate 1. The n-side nitride semiconductor layer 10 includes, for example, an n-type contact layer 3 and an n-side superlattice layer 4. The active layer 5 includes a first barrier layer 5b1 that is nearest to the n-side nitride semiconductor layer 10, and at least one well layer 5w and at least one second barrier layer 5b2 that are disposed above the first barrier layer 5b1. The active layer 5 may have a single quantum-well structure or a multi-quantum-well structure. That is, the active layer 5 may include one or more well layers 5w and one or more second barrier layers 5b2. The p-side nitride semiconductor layer 20 is disposed on the active layer 5 and includes, for example, a first layer 6, the second layer 7, and a p-type contact layer 8 in this order from the active layer 5.

Also, in the p-side nitride semiconductor layer 20, a p-electrode 21 is formed on a portion of a surface of the p-type contact layer 8. An n-electrode 11 is disposed on a surface of the n-type contact layer 3 (i.e., an electrode formation surface) that is exposed by removing a portion of the p-type contact layer 8, the second layer 7, the first layer 6, and the active layer 5.

In particular, in the nitride semiconductor light-emitting element according to the first embodiment, the first barrier layer 5b1 includes a Si-doped InGaN barrier layer (i.e., the lower nitride semiconductor layer) 5b11 and an undoped GaN barrier layer (i.e., the upper nitride semiconductor layer) 5b12 in this order from the n-side nitride semiconductor layer 10 side. In the InGaN barrier layer 5b11, a doping amount of Si at a centeral portion of the InGaN barrier layer is greater than a doping amount of Si at a n-side nitride semiconductor layer 10 side of the InGaN barrier layer and a doping amount of Si at a well layer 5w side of the InGaN barrier layer.

For example, the InGaN barrier layer 5b11 includes a middle portion 5b11m in which Si is substantially uniformly doped, an under portion 5b11u formed on the n-side nitride semiconductor layer 10, and a top portion 5b11t formed on the well layer 5w. The doping amount of Si is lower in the under portion 5b11u and the top portion 5b11t than in the middle portion 5b 11m.

The nitride semiconductor light-emitting element according to the first embodiment having a structure described above includes the first barrier layer 5b1 that includes the Si-doped InGaN barrier layer 5b11 and the undoped GaN barrier layer 5b12. In the InGaN barrier layer 5b 11, a doping amount of Si at the central portion of the InGaN barrier layer 5$b$11 is greater than a doping amount of Si at the n-side nitride semiconductor layer 10 side and a doping amount of Si at the well layer 5$w$ side.

This allows for reducing the forward voltage Vf and improving the light-emission efficiency.

A method of manufacturing a nitride semiconductor light-emitting element according to the present embodiment will be described below.

Figure 2:
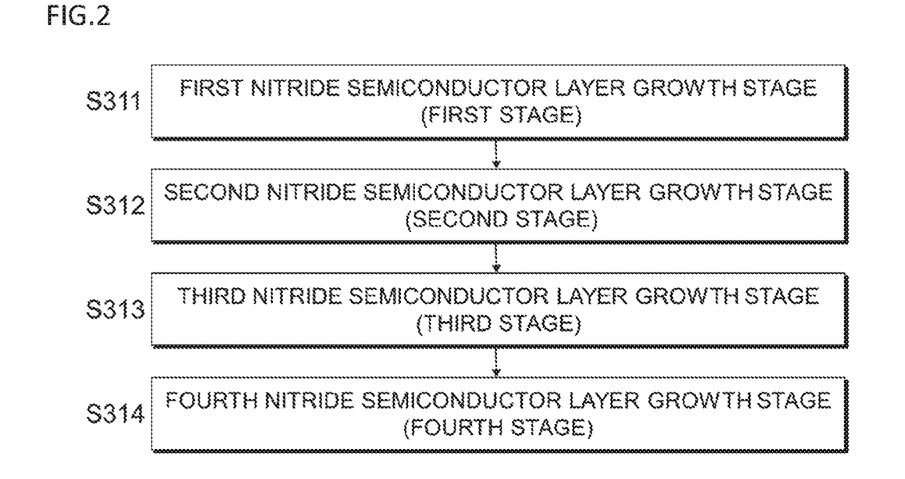
FIG. 2 is a flowchart illustrating a flow of steps of the method of manufacturing a light-emitting element according to the first embodiment of the present invention.

The method of manufacturing the nitride semiconductor light-emitting element according to the present embodiment includes, as shown in FIG. 2, an n-side nitride semiconductor layer growth step S2 of growing the n-side nitride semiconductor layer 10 above the substrate 1, an active layer growth step S3 of growing the active layer 5 on the n-side nitride semiconductor layer 10, and a p-side nitride semiconductor layer growth step S4 of growing the p-side nitride semiconductor layer 20 on the active layer 5. As necessary, the method of manufacturing the nitride semiconductor light-emitting element according to the present embodiment may further include an underlayer growth step S1 of forming a buffer layer and an underlayer on the substrate 1 before the n-side nitride semiconductor layer growth step S2.

Hereinafter, the underlayer growth step S1, the n-side nitride semiconductor layer growth step S2, the active layer growth step S3, and the p-side nitride semiconductor layer growth step S4 will be described below in detail.

1. Underlayer Growth Step S1

In the underlayer growth step S1, for example, the buffer layer is grown at a relatively low temperature in a range of 500° C. to 600° C. Then, on the buffer layer, the underlayer 2 is grown at a temperature in a range of, for example, 1000° C. to 1200° C., which is higher than the temperature under which the buffer layer is grown. The buffer layer may be formed by growing materials such as AlN, GaN, and AlGaN, to a thickness of, for example, several nanometers to several tens of nanometers. Examples of source gases include TMA, TMG, and ammonia gas.

The underlayer 2 can be formed by growing, for example, GaN on the buffer layer to a thickness of, for example, several micrometers. The underlayer 2 may include a plurality of layers. The underlayer 2 including a plurality of layers may be formed such that a plurality of layers having different compositions are grown or a plurality of layers having the same composition are grown under different temperatures.

2. n-Side Nitride Semiconductor Layer Growth Step S2

In the n-side nitride semiconductor layer growth step S2, for example, the n-type contact layer 3 is grown and then the superlattice layer 4 is grown on the n-type contact layer 3. For example, at a temperature of 1000° C. or higher, using TMG, TMA, ammonia, and monosilane as the source gases, an n-type GaN in which Si is doped at an amount of 1 to $5 \times 10^{19}/cm^3$ is grown to have a thickness of 4 μm to 8 μm, so that the n-type contact layer 3 is formed.

The superlattice layer 4 is grown at a temperature of 1000° C. or lower, for example, in a range of 800° C. to 900° C. by, for example, alternately growing first layers 4$a$ and second layers 4$b$, such that each of the first layers 4$a$ of GaN is grown to have a thickness in a range of 1.5 nm to 2.5 nm using TEG and ammonia as the source gases and each of the second layers 4$b$ of $In_xGa_{1-x}N$ is grown to have a thickness in a range of 0.5 nm to 1.5 nm using TEG, TMI, and ammonia as the source gases. The In content x is in a range of, for example, $0.02 \leq x \leq 0.3$, preferably $0.04 \leq x \leq 0.1$.

3. Active Layer Growth Step S3

The active layer growth step S3 includes, as shown in FIG. 2, the first barrier layer growth step S31, the well layer growth step S32, and the second barrier layer growth step S33. In the active layer growth step S3, the well layer growth step S32 and the second barrier layer growth step S33 are repeated until a predetermined number of well layers are formed.

In particular, the method of manufacturing the nitride semiconductor light-emitting element according to the present embodiment is different from that of a conventional method in that the active layer growth step S3 includes the first barrier layer growth step S31 of growing the first barrier layer such that the first barrier layer is disposed between the well layer and the n-side nitride semiconductor layer, the first barrier layer growth step S31 being performed before growing the well layer that is nearest to the n-side nitride semiconductor layer separately from the second barrier layer growth step S33.

The first barrier layer growth step S31, the well layer growth step S32, and the second barrier layer growth step S33 will be described below in detail.

3-1. First Barrier Layer Growth Step S31

Figure 3:
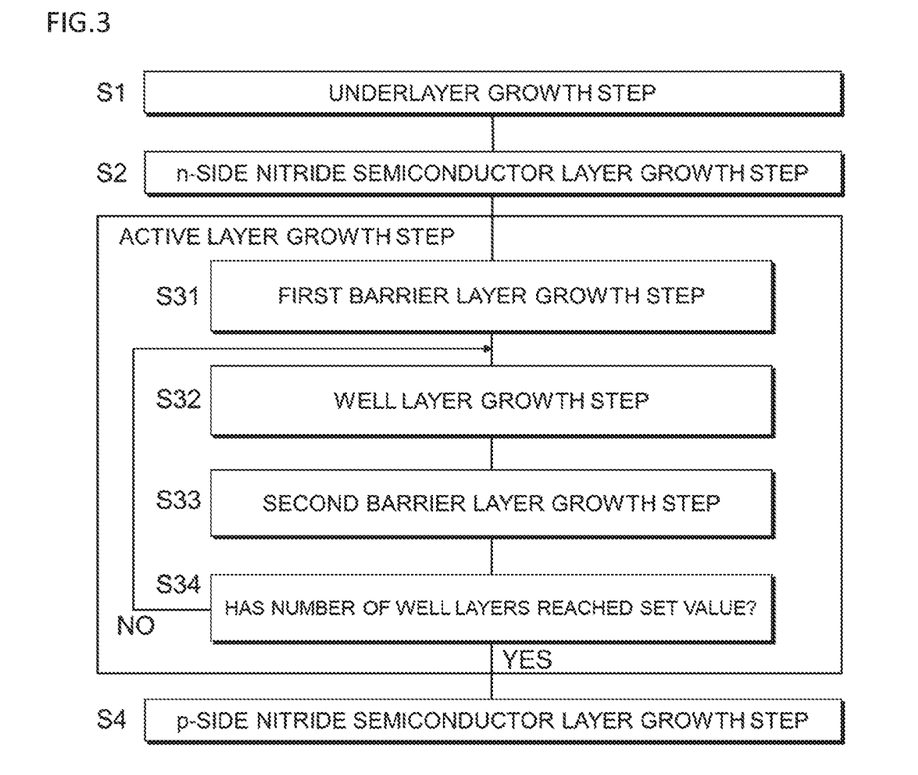
FIG. 3 is a flowchart illustrating a detailed flow of steps in growing a first barrier layer as shown in FIG. 2.

As shown in FIG. 3, the first barrier layer growth step S31 includes a first nitride semiconductor layer growth stage (i.e., a first stage) S311, a second nitride semiconductor layer growth stage (i.e., a second stage) S312, a third nitride semiconductor layer growth stage (i.e., a third stage) S313, and a fourth nitride semiconductor layer growth stage (i.e., a fourth stage) S314.

The first to the fourth stages are preferably performed continuously in the same reactor.

Also, the In, Ga, N, and Si source gases are introduced to the reactor in each of the first, the second, the third stages to grow a first, a second, a third nitride semiconductor layer, respectively.

After the third stage, the fourth nitride semiconductor layer is grown in the fourth stage by using the Ga and N source gases under a growth condition in which the amounts of the In and Si source gases are less than those in the first and the third stages, or the supply of the In and Si source gases are stopped.

The first to the fourth stages will be specifically described below.

3-1-1. First Nitride Semiconductor Layer Growth Stage (i.e., the First Stage) S311

In the first nitride semiconductor layer growth stage (i.e., the first stage) S311, the first nitride semiconductor layer that contains In, for example, that is made of $In_{b1}Ga_{1-b1}N$, is grown to have a first thickness under a growth condition in which the concentration of n-type impurity is set to be a first concentration that is lower than a second concentration to be used in the second nitride semiconductor layer growth stage (the second stage) S312, as will be described below.

The first concentration is set in a range of, for example, $2.0 \times 10^{18}/cm^3$ to $4.0 \times 10^{18}/cm^3$, preferably $2.5 \times 10^{18}/cm^3$ to $3.5 \times 10^{18}/cm^3$. Also, the first thickness is set in a range of 0.1 nm to 0.8 nm, preferably 0.2 nm to 0.5 nm.

In the case of growing the first nitride semiconductor layer made of $In_{b1}Ga_{1-b1}N$, InGaN is grown using, for example, triethylgallium (TEG) as the Ga source gas, for example, trimethylindium (TMI) as the In source gas, and ammonia as the N source gas, while monosilane as the Si source gas is introduced at a low flow rate or the supply of monosilane is stopped. Also, in the case of growing the first nitride semiconductor layer made of $In_{b1}Ga_{1-b1}N$, the In content b1 is set in a range of, for example, 0.001 to 0.1, preferably, 0.005 to 0.03, and is set to be less than the In content of the well layer 5$w$.

3-1-2. Second Nitride Semiconductor Layer Growth Stage (the Second Stage) S312

In the second nitride semiconductor layer growth stage (the second stage) S312, the second nitride semiconductor that contains In, for example, that is made of $In_{b2}Ga_{1-b2}N$, is grown to have a second thickness that is greater than the first thickness under a growth condition in which the concentration of n-type impurity is set to be the second concentration that is higher than the first concentration.

The second concentration is set in a range of, for example, $6.0 \times 10^{18}/cm^3$ to $8.0 \times 10^{18}/cm^3$, preferably $6.5 \times 10^{18}/cm^3$ to $7.5 \times 10^{18}/cm^3$. Also, the second thickness is set in a range of 1.5 nm to 3.5 nm, preferably 2 nm to 3 nm.

Also, the second nitride semiconductor layer is preferably grown under a condition that allows the second nitride semiconductor layer to have a thickness in a range of 70% to 90% of a total thickness of the first to the third nitride semiconductor layers.

With the second nitride semiconductor layer having a thickness of 70% or higher of the total thickness of the first to third nitride semiconductor layers, the second nitride semiconductor layer having the concentration of n-type impurity higher than those in the first and the third nitride semiconductor layers can occupy a relatively large portion of the InGaN barrier layer 5b11. This configuration can reduce deterioration of the forward voltage due to insufficiency of n-type impurity in the InGaN barrier layer 5b11. The second nitride semiconductor layer having a thickness of 90% or lower of the total thickness of the first to third nitride semiconductor layers allows the first and the third nitride semiconductor layers to have a relatively large thickness, and thus the effects exhibited by the first and the third semiconductor layers can be obtained.

In the case of growing the second nitride semiconductor layer made of $In_{b2}Ga_{1-b2}N$, for example, TEG, TMI, and ammonia as the source gases are used as in the growing of the first nitride semiconductor layer, while monosilane is introduced at a low flow rate or the supply of monosilane is stopped during growing InGaN. Also, in the case of growing the second nitride semiconductor layer made of $In_{b2}Ga_{1-b2}N$, the In content b2 is set as in the growing of the first nitride semiconductor layer, for example, in a range of 0.001 to 0.1, preferably 0.005 to 0.03. More preferably, the In content b2 is set to the same content as the In content b1 of the first nitride semiconductor layer.

3-1-3. Third Nitride Semiconductor Layer Growth Stage (the Third Stage) S313

In the third nitride semiconductor layer growth stage (the third stage) S313, the third nitride semiconductor layer that contains In, for example, that is made of $In_{b3}Ga_{1-b3}N$, is grown to have a third thickness that is smaller than the second thickness under a growth condition in which the concentration of n-type impurity is set to be a third concentration that is lower than the second concentration.

The third concentration is set in a range of, for example, $2.0 \times 10^{18}/cm^3$ to $4.0 \times 10^{18}/cm^3$, preferably $2.5 \times 10^{18}/cm^3$ to $3.5 \times 10^{18}/cm^3$. Also, the third thickness is set in a range of 0.1 nm to 0.8 nm, preferably 0.2 nm to 0.5 nm.

Also, in the first and the third stages, the first and the third nitride semiconductor layers are preferably grown under a condition in which the first and the third concentrations is set so as to be equal to or lower than a half of the second concentration. With such a condition, the difference between the n-type impurity concentration of the first nitride semiconductor layer and the n-type impurity concentration of the n-side superlattice layer 4 and the difference between the concentration of n-type impurity of the third nitride semiconductor layer and the concentration of n-type impurity of the fourth nitride semiconductor layers can be relatively small. Accordingly, the crystallinity of the n-side superlattice layer 4 and the first to fourth nitride semiconductor layers can be improved.

In the case of growing the third nitride semiconductor layer made of $In_{b3}Ga_{1-b3}N$, InGaN is grown using, for example, TEG, TMI, and ammonia as the source gases, while monosilane is introduced at a low flow rate or the supply of monosilane is stopped. In the case of growing the third nitride semiconductor layer made of $In_{b3}Ga_{1-b3}N$, the In content b3 is set as in the growing of the first nitride semiconductor layer, for example, in a range of 0.001 to 0.1, preferably, 0.005 to 0.03, and the In content b3 is more preferably set to the same content as the In content b2 of the second nitride semiconductor layer.

The In contents of b1 to b3 are preferably less than the In content of the well layer 5w. This configuration allows for reducing deterioration of crystallinity due to the presence of In.

3-1-4. Fourth Nitride Semiconductor Layer Growth Stage (the Fourth Stage) S314

In the fourth nitride semiconductor layer growth stage (the fourth stage) S314, the fourth nitride semiconductor that contains no In, for example, that is made of GaN, is grown to have a fourth thickness under a growth condition in which the supply of the impurity source gas is stopped or the flow rate of the impurity source gas is set to be less than those in the first nitride semiconductor layer growth stage (the first stage) S311 and the third nitride semiconductor layer growth stage (the third stage) S313. The fourth thickness is set in a range of 1 nm to 2.5 nm, preferably 1.5 nm to 2 nm.

Through the stages described above, the first barrier layer 5b1 that includes a Si-doped InGaN barrier layer 5b 11 and an undoped GaN barrier layer 5b12 in this order from the n-side nitride semiconductor layer 10 side is formed. In the InGaN barrier layer 5b11, the distribution of the doping amount of Si is higher at the center than in the n-side nitride semiconductor layer 10 side and the well layer 5w side.

3-2. Well Layer Growth Step S32

In the well layer growth step S32, the well layer 5w is grown on the first barrier layer 5b1.

The well layer 5w is made of, for example, $In_wGa_{1-w}N$, and the In content of the well layer 5w may be higher than in that of the InGaN barrier layer 5b11 of the first barrier layer 5b1. The well layer 5w is grown to have a thickness of, for example, 2 nm to 5 nm, preferably 3 nm to 4.5 nm. The In content w of the well layer 5w is set according to wavelengths of light to be emitted, for example, set in a range of $0.5 \leq w \leq 3$, preferably $1 \leq w \leq 2$. The well layer 5w is grown at a temperature of, for example, 800° C. to 900° C. using, for example, TEG, TMI, and ammonia as the source gases.

Also, in the well layer growth step S32, each well layer 5w may be grown such that, for example, an In content in the initial stage of growth, where a corresponding InGaN layer is grown to have a thickness in a range of 0.2 nm to 0.8 nm, and an In content in the final stage, where a thickness of a corresponding InGaN layer is grown to have a thickness in a range of 0.2 nm to 0.8 nm, are less than In content w of another stage in the well layer 5w. Thus, in the well layer growth step S32, growing the well layer 5w such that the In content of each of the layers grown in the initial and the final stages is less than In content w of another stage, crystallinity of whole well layer 5w can be good so as to achieve high light-emission efficiency.

FIG. 1 schematically shows the InGaN layers grown in the initial and the final stages with reference numerals 5w1 and 5w3, respectively, and the InGaN layer grown between the initial and final stages with a reference numeral 5w2.

3-3. Second Barrier Layer Growth Step S33

In the second barrier layer growth step S33, the second barrier layer 5b2 is grown on the well layer 5w.

More specifically, the second barrier layer 5b2 made of undoped GaN is grown at a temperature, for example, in a range of 800° C. to 900° C., using, for example, TEG and ammonia as the source gases to have a thickness of, for example, 3 nm to 5 am. Instead of the undoped GaN, the second barrier layer may be made of a nitride semiconductor that has a band gap larger than that of the well layer 5w, such as an InGaN that has an In content less than that in the well layer 5w.

In the case of growing the active layer including a plurality of well layers, the well layer growth step S32 and the second barrier layer growth step S33 are repeated until a predetermined number of well layers 5w are formed (S34).

When the active layer includes a plurality of second barrier layers 5b2, all the second barrier layers 5b2 are preferably grown without containing n-type impurity. This allows for reducing deterioration of crystallinity due to the n-type impurity and improving the crystallinity of the well layer 5w formed on the second barrier layer 5b2.

3-4. p-Side Nitride Semiconductor Layer Growth Step S4

In the p-side nitride semiconductor layer growth step S4, the first layer 6, the second layer 7, and the p-type contact layer 8 are sequentially grown to form the p-side nitride semiconductor layer 20.

In the p-side nitride semiconductor layer 20, the first layer 6 is grown in contact with the second barrier layer 5b2 that is nearest to the p-side nitride semiconductor layer 20, such that the first layer 6 has a bandgap smaller than that of the second barrier layer 5b2 that is nearest to the p-side nitride semiconductor layer 20 and larger than that of the well layer 5w and has a thickness smaller than that of the second barrier layer 5b2 that is nearest to the p-side nitride semiconductor layer 20.

More specifically, the first layer 6 made of, for example, a nitride semiconductor, such as $In_yGa_{1-y}N$, containing In at content less than a content of In in the well layer 5w, is grown using, for example, TEG, TMI, and ammonia as the source gases, such that the first layer 6 has a thickness of, for example, 1 nm to 3 nm, which is smaller than a thickness of the second barrier layer 5b2. In the case of forming the first layer 6 made of $In_yGa_{1-y}N$, the In content y is set to be less than that of the well layer 5w, for example, in a rage of 0.01 to 0.1, and the first layer 6 is grown at a temperature of, for example, 800° C. to 900° C.

Next, the second layer 7 is grown such that the second layer 7 includes p-type impurity and has a bandgap larger than that of the second barrier layer 5b2 that is nearest to the p-side nitride semiconductor layer 20. More specifically, the second layer 7 made of a nitride semiconductor that contains Al, for example, $Al_zGa_{1-z}N$, in which p-type impurity such as Mg is doped is grown using, for example, TEG, TMA, ammonia, and cyclopentadienyl magnesium ($Cp_2Mg$), such that the second layer 7 has a thickness of 5 nm to 15 nm.

In the case of forming the second layer 7 made of Mg-doped $Al_zGa_{1-z}N$, the Al content z is set in a range of, for example, 0.1 to 0.2, and a doped amount of Mg is set in a range of $0.5 \times 10^{20}/cm^3$ to $1.5 \times 10^{20}/cm^3$, and the second layer 7 is grown at a temperature in a range of, for example, 800° C. to 900° C.

Subsequently, the p-type contact layer 8 is grown on the second layer 7. The p-type contact layer 8 is made of a nitride semiconductor in which the p-type impurity such as Mg is doped. For example, in the case of forming the p-type contact layer 8 made of the Mg-doped GaN, the Mg is doped in a range of $2 \times 10^{20}/cm$; to $8 \times 10^{20}/cm^3$, and the p-type contact layer 8 is grown to have a thickness in a range of for example, 10 nm to 50 nm.

In the p-side nitride semiconductor layer growth step S4, an undoped nitride semiconductor layer, such as an undoped GaN layer, may be grown between the second layer 7 and the p-type contact layer 8. The p-type contact layer 8 may be grown on the nitride semiconductor layer.

Further, after growing the p-type contact layer 8, annealing is preferably preformed under a nitrogen atmosphere at a temperature in a range of 650° C. to 750° C. to reduce resistivities of the second layer 7 including the p-type impurity and the p-type contact layer 8.

Also, after growing the p-side nitride semiconductor layer 20 as described above, the p-electrode 21 is formed on a portion of a surface of the p-type contact layer 8. The n-electrode 11 is formed on a surface of the n-type contact layer 3 (an electrode formation surface) that is exposed by removing a portion of the p-type contact layer 8, the second layer 7, the first layer 6, and the active layer 5.

The nitride semiconductor light-emitting element produced using the method of manufacturing the nitride semiconductor light-emitting element according to the embodiment described above includes the first barrier layer 5b1 that includes the Si-doped InGaN barrier layer 5b11 and the undoped GaN barrier layer 5b12. In the InGaN barrier layer 5b11, a doping amount of Si at a centeral portion of the InGaN barrier layer 5b11 is greater than a doping amount of Si at an n-side nitride semiconductor layer 10 side and a doping amount of Si at a well layer 5w side of the InGaN barrier layer 5b11. This allows for reducing the forward voltage Vf and improving the light-emission efficiency.

EXAMPLES

Example 1

In Example 1, a nitride semiconductor light-emitting element according to Case 1 described above was produced as described below.

Substrate 1

A c-plane sapphire was used for a substrate 1, and the substrate was subjected to surface cleaning performed at 1050° C. in a hydrogen atmosphere in a MOCVD reaction vessel.

Buffer Layer

The temperature was set at 550° C., and a buffer layer made of AlGaN was grown on the substrate 1, using TMA, TMG, and ammonia as the source gases, such that the buffer layer had a thickness of approximately 12 nm.

Underlayer 2

The temperature was set at 1050° C., and a first underlayer made of GaN was grown on the substrate, using TMG and ammonia as the source gases, such that the first underlayer had a thickness of approximately 1 μm.

Subsequently, the temperature was set at 1150° C., and a second underlayer made of GaN was grown on the substrate, using TMG and ammonia as the source gases, such that the second underlayer had a thickness of approximately 1 μm.

As described above, an underlayer 2 composed of the first and the second layers was grown. n-type contact layer 3

Next, at the temperature of 1150° C., using TMG, TMA, ammonia, and monosilane, an n-type contact layer 3 was formed by growing an n-type GaN doped with Si at an amount of $1\times10^{19}/cm^3$ such that the n-type contact layer 3 had a thickness of 6 µm.

Superlattice Layer 4

Next, the temperature was set at 860° C., and layers made of GaN and layers made of $In_{0.07}Ga_{0.93}N$ were alternately grown using TEG, TMI, and ammonia as the source gases to form 20 pairs of the layers made of GaN and the layers made of $In_{0.07}Ga_{0.93}N$, such that each of the layers made of GaN had a thickness of 2 nm and each of the layers made of $In_{0.07}Ga_{0.93}N$ had a thickness of 1 nm.

Active Layer 5

(a1) Growing First Barrier Layer

The temperature was set to 860° C., and using TEG, TMI, ammonia, and monosilane as the source gases, a first nitride semiconductor layer 5b11u made of $In_{0.008}Ga_{0.992}N$ was grown to have a thickness of 0.5 nm such that Si was doped at an amount of $3\times10^{18}/cm^3$, with adjustment of the flow rate of monosilane (impurity gas). Then, a second nitride semiconductor layer 5b11m made of $In_{0.008}Ga_{0.992}N$ was grown to have a thickness of 2.4 nm using the source gas that contains monosilane (impurity gas) at an increased flow rate such that Si was doped at an amount of $6\times10^{18}/cm^3$. Further, with reduction in the flow rate of monosilane (impurity gas), a third nitride semiconductor layer 5b11t made of $In_{0.008}Ga_{0.992}N$ was grown to have a thickness of 0.5 nm such that Si was doped at an amount of $3\times10^{18}/cm^3$.

Subsequently, TMI, which is used as the In source gas, and monosilane, which is used as the Si impurity source gas, were stopped, and the fourth nitride semiconductor layer 5b12 made of GaN was grown to have a thickness of 1.7 nm.

As described above, the first barrier layer 5b1 was grown to have a thickness of 5.1 nm.

(a2) Growing Well Layer

The temperature was set at 860° C., and the well layer 5w made of $In_{0.16}Ga_{0.84}N$ was grown to have a thickness of 3.8 nm, using TEG, TMI, and ammonia as the source gases. In the growing of the well layer 5w, the well layer 5w was grown with reduction in flow rate of TMI, which was In source, in the initial stage where a corresponding InGaN layer was grown to have a thickness of 0.3 nm and the final stage where a corresponding InGaN layer was grown to have a thickness of 0.3 nm, such that In content in each of the InGaN layers grown in the initial stage and the final stage was reduced.

(a3) Growing Second Barrier Layer

Next, the temperature was set at 860° C., and a second barrier layer 5b2 made of GaN was grown, using TEG and ammonia as the source gases, to a thickness of 4.2 am.

Then, the step (a2) of growing well the layer 5w and the step (a3) of growing the second barrier layer 5b2 were repeated seven times, so that the active layer 5 with a multi-quantum-well structure including eight pairs of the well layer 5w and the second barrier layer 5b2 was formed.

First Layer 6

Next, the temperature was set at 840° C., and a first layer 6 made of $In_{0.05}Ga_{0.95}N$ was grown on the final second barrier layer 5b2, using TEG, TMI, and ammonia as the source gases, to have a thickness of 2 nm.

Second Layer 7

Next, at 840° C., using TEG, TMA, ammonia, and cyclopentadienyl magnesium ($Cp_2Mg$), the second layer 7 made of $Al_{0.17}Ga_{0.83}N$ doped with Mg at an amount of $1\times10^{20}/cm^3$ was grown to have a thickness of 10 nm.

P-Type Contact Layer 8

Subsequently, an undoped GaN was grown to have a thickness of 100 nm on the second layer 7, and a p-type contact layer 8 made of GaN doped with Mg at an amount of $5\times10^{20}/cm^3$ was grown on the undoped GaN layer, using TMG, ammonia, and $Cp_2Mg$, to have a thickness of 23 nm.

After growth, in a nitrogen atmosphere, the wafer was set inside the reaction vessel and annealing was performed at 700° C. to reduce resistance of the second layer 7 and the p-type contact layer 8.

After annealing, a portion of each of the p-type contact layer 8, the second layer 7, the first layer 6, and the active layer 5 was removed to expose a surface (an electrode formation surface) for forming an n-electrode 11.

A p-electrode 21 and the n-electrode 11 were formed on a portion of the surface of the p-type contact layer 8 and the electrode formation surface, respectively.

In Example 1, when the forward current was 120 mA, the forward voltage Vf of the light-emitting element was 3.04 V and the emission intensity was 254.1 mW.

Comparative Example

A light-emitting element in the Comparative Example was produced in substantially the same manner as in Example 1 except that a first barrier layer of an active layer was grown as described below.

The first barrier layer of the light-emitting element in the Comparative Example was formed by growing a nitride semiconductor layer made of $In_{0.008}Ga_{0.992}N$ in which Si was doped at an amount of $6\times10^{18}/cm^3$ to have a thickness of 3.4 nm, and growing a fourth nitride semiconductor layer made of GaN on the nitride semiconductor layer to have a thickness of 1.7 nm.

Reference Example 1

A light-emitting element in Reference Example 1 was produced in substantially the same manner as in Example 1 except that a first barrier layer of an active layer was formed as described below.

The first barrier layer of the light-emitting element in Reference Example 1 was formed by growing a first nitride semiconductor layer made of $In_{0.008}Ga_{0.992}N$ in which Si was doped at an amount of $3\times10^{18}/cm^3$ to have a thickness of 1.5 nm, growing a second nitride semiconductor layer made of $In_{0.008}Ga_{0.992}N$ in which Si was doped at an amount of $6\times10^{18}/cm^3$ on the first nitride semiconductor layer to have a thickness of 2.4 nm, and growing the fourth nitride semiconductor layer made of GaN on the second nitride semiconductor layer to have a thickness of 1.7 nm.

Reference Example 2

A light-emitting element in Reference Example 2 was produced in substantially the same manner as in Example 1 except that a first barrier layer of an active layer was formed as described below.

The first barrier layer of the light-emitting element in Reference Example 2 was formed by growing a second nitride semiconductor layer made of $In_{0.008}Ga_{0.992}N$ in which Si was doped at an amount of $6\times10^{18}/cm^3$ to have a thickness of 2.4 nm, growing a third nitride semiconductor layer made of $In_{0.008}Ga_{0.992}N$ in which Si was doped at an amount of $3\times10^{18}/cm^3$ on the second nitride semiconductor layer to have a thickness of 1.0 am, and growing a fourth nitride semiconductor layer made of GaN on the third nitride semiconductor layer to have a thickness of 1.7 nm.

For each of the above light-emitting elements in the Comparative Example, Reference Examples 1 and 2, when the forward current was 120 mA, the forward voltage Vf, emission intensity and power efficiency were evaluated.

The results are shown in Table 1 together with the evaluation results of Example 1.

TABLE 1

|  | Example 1 | Comparative Example | Reference Example 1 | Reference Example 2 |
|---|---|---|---|---|
| Forward voltage Vf (V): 120 mA | 3.04 | 3.03 | 3.05 | 3.07 |
| Emission intensity (mW): 120 mA | 254.1 | 252.4 | 253.6 | 253.7 |
| Power efficiency (%): 120 mA | 69.7 | 69.5 | 69.3 | 68.8 |

As shown in Table 1, it was confirmed that increase in the forward voltage Vf is smaller and the emission intensity (mW) is greater in the light-emitting element according to Example 1 than those in the Comparative Example.

On the other hand, while increase in the forward voltages Vf of the light-emitting elements in Reference Examples 1 and 2 was larger than that of the light-emitting element in Example 1, the emission intensity (mW) of the light-emitting elements in Reference Examples 1 and 2 were smaller than those of the light-emitting element in Example 1.

Example 2

A light-emitting element in Example 2 was produced in substantially the same manner as in Example 1 except that a first barrier layer of an active layer 5 was formed as described below. More specifically, the light-emitting element in Example 2 was produced as below.

(i) At the temperature of 860° C., using TEG, TMI, ammonia, and monosilane as the source gases, a first nitride semiconductor layer 5*b*11*u* made of $In_{0.008}Ga_{0.992}N$ was grown to have a thickness of 0.3 nm such that Si was doped at an amount of $3\times10^{18}/cm^3$ with adjustment of the flow rate of monosilane (impurity gas).

(ii) A second nitride semiconductor layer 5*b*11*m* made of $In_{0.008}Ga_{0.992}N$ was grown to have a thickness of 2.8 nm using the source gas that contains monosilane (impurity gas) at an increased flow rate such that Si was doped at an amount of $6.64\times10^{18}/cm^3$.

(iii) Further, a third nitride semiconductor layer 5*b*11*t* made of $In_{0.008}Ga_{0.992}N$ was grown to have a thickness of 0.3 nm, with the flow rate of monosilane (impurity gas) reduced such that Si was doped at an amount of $3\times10^{18}/cm^3$.

(iv) Subsequently, supply of TMI as the In source gas and monosilane as the Si impurity source gas were stopped, and the fourth nitride semiconductor layer 5*b*12 made of GaN was grown to have a thickness of 1.7 nm.

The first barrier layer 5*b*1 was thus formed to have a thickness of 5.1 nm.

The forward voltage Vf emission intensity, and power efficiency when the current of 150 mA were applied to the light-emitting element of Example 2 produced as described above were evaluated.

The results are shown below.
Forward voltage Vf 3.10 V,
Emission intensity. 307 mW, and
Power efficiency: 66%.

While certain embodiments have been described, it should be understood that the scope of the present invention is not limited to the embodiments described above.

What is claimed is:

1. A method of manufacturing a nitride semiconductor light-emitting element, the method comprising:
   growing an n-side nitride semiconductor layer on a substrate;
   growing an active layer on the n-side nitride semiconductor layer; and
   growing a p-side nitride semiconductor layer on the active layer,
   wherein the step of growing the active layer comprises, before growing a well layer that is nearest to the n-side nitride semiconductor layer, growing a first barrier layer such that first barrier layer is located between the well layer and the n-side nitride semiconductor layer,
   wherein the step of growing the first barrier layer comprises:
   a first stage in which a first nitride semiconductor layer that contains In is grown to have a first thickness under a growth condition in which a concentration of n-type impurity is set to be a first concentration,
   after the first stage, a second stage in which a second nitride semiconductor layer that contains In is grown to have a second thickness greater than the first thickness under a growth condition in which the concentration of n-type impurity is set to be a second concentration higher than the first concentration,
   after the second stage, a third stage in which a third nitride semiconductor layer that contains In is grown to have a third thickness smaller than the second thickness under a growth condition in which the concentration of n-type impurity is set to be a third concentration lower than the second concentration, and
   after the third stage, a fourth stage in which a fourth nitride semiconductor layer is grown to have a fourth thickness under a growth condition, in which an amount of an impurity source gas is less than the impurity source gas supplied during the first stage and the third stage or supply of the impurity source gas is stopped.

2. The method of manufacturing a nitride semiconductor light-emitting element according to claim 1,
   wherein the first to fourth stages are continuously performed in the same reactor,
   wherein, in each of the first to third stages, source gases of In, Ga, N, and Si are introduced to the reactor to grow a respective one of the first nitride semiconductor layer, the second nitride semiconductor layer, and the third nitride semiconductor layer, and
   wherein, in the fourth stage, the fourth nitride semiconductor layer is grown using the Ga and N source gases under a growth condition in which an amount of the In source gas and an amount of Si source gases are less than those in the first and the third stages, or while the supply of the In and Si source gases are stopped.

3. The method of manufacturing a nitride semiconductor light-emitting element according to claim 2,
   wherein the well layer contains In, and
   wherein an In content of each of the first to third nitride semiconductor layers is less than an In content of the well layer.

4. The method of manufacturing a nitride semiconductor light-emitting element according to claim 1, wherein, in the second stage, the second nitride semiconductor layer is grown under a condition in which the second nitride semiconductor layer is set to have a thickness in a range of 70% to 90% of a total thickness of the first to the third nitride semiconductor layers.

5. The method of manufacturing a nitride semiconductor light-emitting element according to claim 2, wherein, in the second stage, the second nitride semiconductor layer is grown under a condition in which the second nitride semiconductor layer is set to have a thickness in a range of 70% to 90% of a total thickness of the first to the third nitride semiconductor layers.

6. The method of manufacturing a nitride semiconductor light-emitting element according to claim 3, wherein, in the second stage, the second nitride semiconductor layer is grown under a condition in which the second nitride semiconductor layer is set to have a thickness in a range of 70% to 90% of a total thickness of the first to the third nitride semiconductor layers.

7. The method of manufacturing a nitride semiconductor light-emitting element according to claim 1, wherein, in the first and the third stages, the first and the third nitride semiconductor layers are grown under a condition in which the first and the third concentrations are set to be equal to or lower than half of the second concentration.

8. The method of manufacturing a nitride semiconductor light-emitting element according to claim 2, wherein, in the first and the third stages, the first and the third nitride semiconductor layers are grown under a condition in which the first and the third concentrations are set to be equal to or lower than half of the second concentration.

9. The method of manufacturing a nitride semiconductor light-emitting element according to claim 3, wherein, in the first and the third stages, the first and the third nitride semiconductor layers are grown under a condition in which the first and the third concentrations are set to be equal to or lower than half of the second concentration.

10. The method of manufacturing a nitride semiconductor light-emitting element according to claim 1,
wherein, in the step of growing the active layer, a plurality of well layers, including the well layer, and a plurality of barrier layers, including the first barrier layer, are grown, and
wherein, of the plurality of barrier layers, only the first barrier layer contains an n-type impurity.

11. The method of manufacturing a nitride semiconductor light-emitting element according to claim 2,
wherein, in the step of growing the active layer, a plurality of well layers, including the well layer, and a plurality of barrier layers, including the first barrier layer, are grown, and
wherein, of the plurality of barrier layers, only the first barrier layer contains an n-type impurity.

12. The method of manufacturing a nitride semiconductor light-emitting element according to claim 3,
wherein, in the step of growing the active layer, a plurality of well layers, including the well layer, and a plurality of barrier layers, including the first barrier layer, are grown, and
wherein, of the plurality of barrier layers, only the first barrier layer contains an n-type impurity.

13. The method of manufacturing a nitride semiconductor light-emitting element according to claim 1, wherein the first concentration is $2.0\times10^{18}/cm^3$ or greater and $3.0\times10^{18}/cm^3$ or less, the second concentration is $6.0\times10^{18}/cm^3$ or greater and $8.0\times10^{18}/cm^3$ or less, and the third concentration is $2.0\times10^{18}/cm^3$ or greater and $3.0\times10^{18}/cm^3$ or less.

14. The method of manufacturing a nitride semiconductor light-emitting element according to claim 1, wherein the first thickness is 0.1 nm or greater and 0.5 nm or less, the second thickness is 2 nm or greater and 3 nm or less, and the third thickness is 0.1 nm or greater and 0.5 nm or less.

15. The method of manufacturing a nitride semiconductor light-emitting element according to claim 1, wherein the fourth thickness is 100 nm or greater and 200 nm or less.

* * * * *